(12) United States Patent
Moreno

(10) Patent No.: US 8,426,950 B2
(45) Date of Patent: Apr. 23, 2013

(54) DIE PACKAGE INCLUDING MULTIPLE DIES AND LEAD ORIENTATION

(75) Inventor: Tomas Moreno, Hollister, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 147 days.

(21) Appl. No.: 12/833,781

(22) Filed: Jul. 9, 2010

(65) Prior Publication Data

US 2011/0169144 A1 Jul. 14, 2011

Related U.S. Application Data

(60) Provisional application No. 61/294,724, filed on Jan. 13, 2010.

(51) Int. Cl.
*H01L 23/52* (2006.01)
*H01L 23/538* (2006.01)
*H01L 21/60* (2006.01)

(52) U.S. Cl.
USPC .......................................................... 257/666

(58) Field of Classification Search .......... 257/135–136, 257/242, 329, E27.091, E27.095–E27.096, 257/E29.118, E29.274, E29.313, E29.318, 257/E29.262, 137, 156, 173, 192, E21.41, 257/E21.629, E21.643, E27.015, E27.017, 257/E27.03–E27.032, E27.109, E29.194–E29.225, 257/E21.382–E21.385, E21.695–E21.696, 257/787–796, E23.001–E23.194, E21.499–E21.519, 257/666–677, 678–733; 438/15, 26, 51, 438/55, 64, 106, 124–127, 202–208, 234–239, 438/123
See application file for complete search history.

(56) References Cited

U.S. PATENT DOCUMENTS

| 7,250,672 | B2 * | 7/2007 | Pavier et al. | 257/691 |
| 7,391,100 | B2 * | 6/2008 | Luo et al. | 257/666 |
| 7,485,954 | B2 * | 2/2009 | Havanur | 257/686 |
| 7,882,482 | B2 * | 2/2011 | Ueunten | 716/100 |
| 8,017,440 | B2 * | 9/2011 | Machida | 438/109 |
| 2005/0145996 | A1 * | 7/2005 | Luo et al. | 257/666 |
| 2005/0151236 | A1 * | 7/2005 | Oliver et al. | 257/685 |
| 2007/0196950 | A1 * | 8/2007 | Shirai et al. | 438/106 |
| 2008/0044955 | A1 * | 2/2008 | Salcedo et al. | 438/140 |
| 2009/0160036 | A1 * | 6/2009 | Grey | 257/666 |
| 2009/0230518 | A1 * | 9/2009 | Liu et al. | 257/666 |
| 2009/0294936 | A1 * | 12/2009 | Liu et al. | 257/675 |

OTHER PUBLICATIONS

Fairchild Semiconductor Corporation; FDMS9600S. Dual N-Channel PowerTrench® MOSFET; located at www.fairchildsemi.com/ds/FD/FDMS9600S.pdf; Sep. 2008; 9 pages.*
Fairchild Semiconductor Corporation; "Applicatin Note AN-9056 Using Fairchild Semiconductor Dual Cool TM MOSFETs".*

\* cited by examiner

*Primary Examiner* — Dao H Nguyen
*Assistant Examiner* — Tram H Nguyen
(74) *Attorney, Agent, or Firm* — Hiscock & Barclay, LLP

(57) ABSTRACT

A semiconductor die package and method of making the package. The package may have four semiconductor dies with one or more internally connected switch nodes, and may form a dual output or phase synchronous buck converter. The package may have control leads at opposite sides of the package from each other. Furthermore, the package may contain high side semiconductor dies that are oriented perpendicular to low side semiconductor dies.

12 Claims, 7 Drawing Sheets

DIE PACKAGE INCLUDING MULTIPLE DIES AND LEAD ORIENTATION

CROSS-REFERENCES TO RELATED APPLICATIONS

The present application claims benefit under 35 U.S.C. §119(e) of U.S. Provisional Patent Application No. 61/294,724, entitled "Quad FET for Synchronous Buck Converters," filed Jan. 13, 2010, the entire disclosure of which is incorporated herein by reference for all purposes.

BACKGROUND

A number of semiconductor die packages for power MOSFETs (metal oxide semiconductor field effect transistors) exist. For example, some semiconductor die packages may contain two MOSFETs, and can be connected to larger circuits.

While existing semiconductor die packages are useful, a number of improvements can be made. For example, it would be desirable if semiconductor die packages could contain more semiconductors, to allow for greater flexibility in circuit design and more compact applications. Further, existing lead configurations may cause signal transmission losses, and are not always easy for an OEM (original equipment manufacturer) to use. Some of these existing packages, in certain cases, may have similar connections (e.g., inputs or outputs) separated from each other at a distance, and may thus require longer or more electrical connections to the rest of the circuit.

For example, some output connections may be on opposite sides of a package from each other, such that any circuit board that is used to support the package would need to have circuit traces (e.g., pads) that are similarly separated. This makes it difficult for one designing the circuit board.

Embodiments of the invention address the above problems and other problems individually and collectively.

BRIEF SUMMARY

Embodiments of the invention are directed to semiconductor die packages and methods for making the same.

One embodiment of the invention is directed to a semiconductor die package comprising a leadframe structure having a plurality of die attach pads and a plurality of leads extending from the plurality of die attach pads, wherein the plurality of leads comprises at least a first control lead, a second control lead, a third control lead, and a fourth control lead; a plurality of semiconductor dies, wherein each semiconductor die in the plurality of semiconductor dies is attached to a die attach pad in the plurality of die attach pads; and a housing comprising an exterior surface and at least partially covering the plurality of semiconductor dies, wherein the first control lead and the third control lead are at opposite sides of the semiconductor die package from the second control lead and the fourth control lead.

Another embodiment is directed to a method for making a semiconductor die package, the method comprising obtaining a leadframe structure having a plurality of die attach pads and a plurality of leads extending from the plurality of die attach pads, wherein the plurality of leads comprises at least a first control lead, a second control lead, a third control lead, and a fourth control lead; obtaining a plurality of semiconductor dies; attaching each die attach pad in the plurality of die attach pads to a semiconductor die in the plurality of semiconductor dies; and providing a housing comprising an exterior surface on each semiconductor die to form the semiconductor die package, wherein the first control lead and the third control lead are at opposite sides of the semiconductor die package from the second control lead and the fourth control lead.

These and other embodiments of the invention are described in further detail below with reference to the drawings.

BRIEF DESCRIPTION OF THE DRAWINGS

In the Figures, like numerals designate like elements and the descriptions of some elements may or may not be repeated.

DETAILED DESCRIPTION

Embodiments disclosed herein are directed to semiconductor die packages, such as for use in dual output or phase synchronous buck converters. In certain embodiments, the semiconductor die packages may each contain four semiconductor devices (such as MOSFETs), and have one or more internally connected switch nodes. In certain embodiments, the semiconductor die package may have four control leads, on opposing sides of the package. It is understood, however, that certain embodiments of the invention can include any number of semiconductor devices, switch nodes, and/or control leads.

An exemplary embodiment of a semiconductor die package can comprise a leadframe structure having a plurality of die attach pads, and a plurality of leads extending from the plurality of die attach pads. The plurality of leads can comprise at least a first control lead, a second control lead, a third control lead, and a fourth control lead. The package can also include a plurality of semiconductor dies and a housing at least partially covering the plurality of semiconductor dies. Each semiconductor die in the plurality of semiconductor dies can be attached to a die attach pad in the plurality of die attach pads. The first control lead and the third control lead can be at opposite sides of the semiconductor die package from the second control lead and the fourth control lead. In this embodiment there may be four semiconductor dies within the package; two of the semiconductor dies may each comprise a low side semiconductor device, and the other two semiconductor dies may each comprise a high side semiconductor device. Within the package, the low side semiconductor device may be oriented perpendicular to the high side semiconductor devices. The semiconductor dies may each comprise a vertical power MOSFET, and may form at least a portion of a dual output buck converter circuit. This package layout provides many advantages, which will be described in greater detail below.

Figure 1:
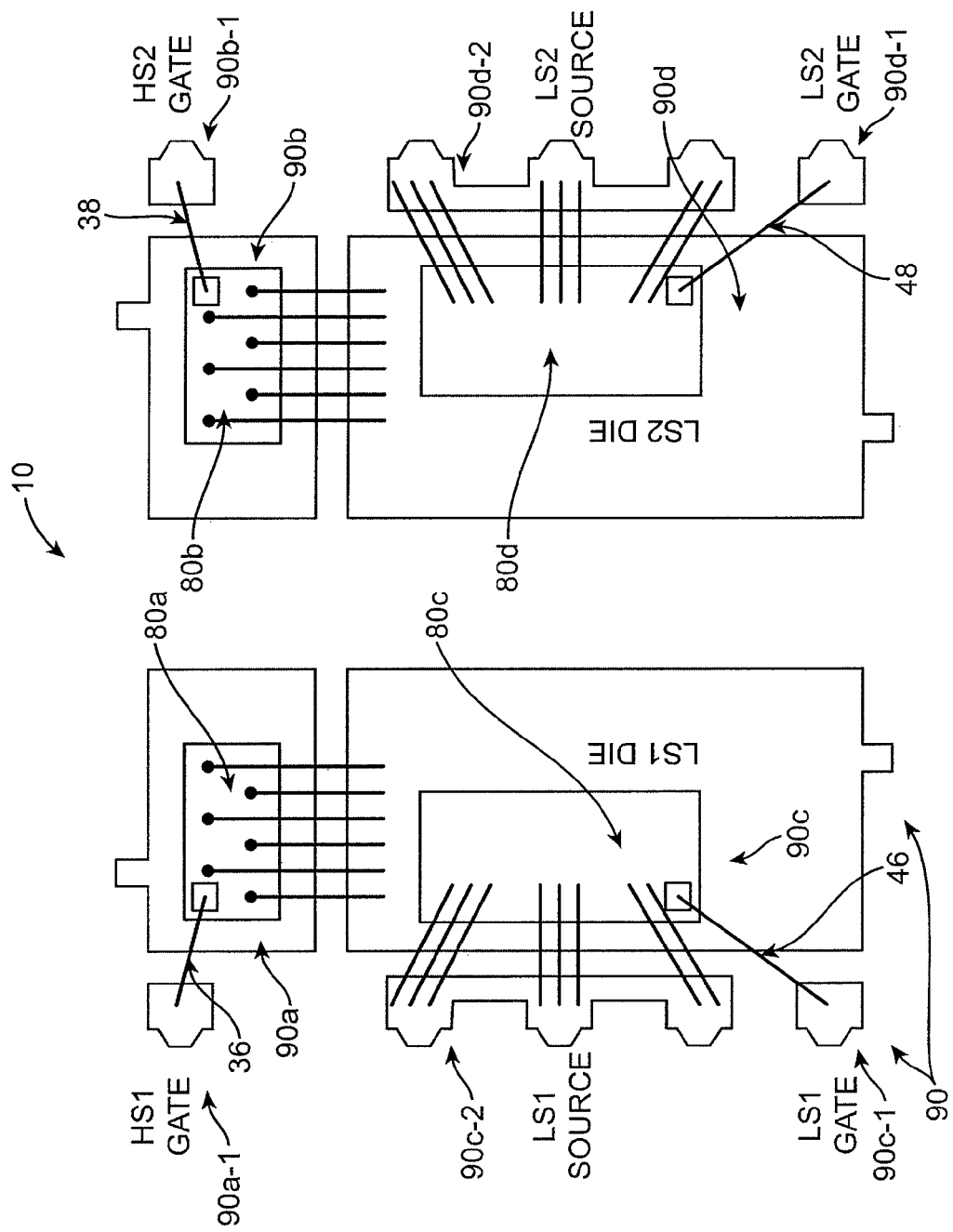
FIG. 1 shows a top view of a package without a molding material.

An exemplary semiconductor die package and pinout convention, according to one embodiment of the invention, is shown in FIG. 1. In FIG. 1, the housing of the semiconductor die package 10 is not shown, to illustrate the internal features. The package 10 includes a leadframe structure 90 comprising four die attach pads (i.e., a plurality of die attach pads): a first die attach pad 90a, a second die attach pad 90b, a third die attach pad 90c, and a fourth die attach pad 90d. The semiconductor die package 10 may further comprise a plurality of semiconductor dies. Each semiconductor die in the plurality of dies can be attached to a die attach pad in the plurality of die attach pads, and each die attach pad in the plurality of die attach pads can serve as a drain connection (e.g., to a external device such as a PCB) for a different semiconductor die. As such, the package 10 can have a first semiconductor die 80a attached to the first die attach pad 90a as a drain connection, a second semiconductor die 80b attached to the second die attach pad 90b as a drain connection, a third semiconductor die 80c attached to the third die attach pad 90c as a drain connection, and a fourth semiconductor die 80d attached to the fourth die attach pad 90d as a drain connection. In certain embodiments, the leadframe structure 90 can comprise at least four leadframe structure portions, with each die attach pad being part of a separate leadframe structure portion.

The leadframe structure 90 may comprise any suitable material. Exemplary leadframe structure materials include metals such as copper, aluminum, gold, etc., and alloys thereof. The leadframe structures may also include plated layers such as plated layers of gold, chromium, silver, palladium, nickel, etc. The leadframe structure may also have any suitable thickness, including a thickness less than about 8 mils (or more or less than this).

The leadframe structure can be stamped, etched and/or patterned using conventional processes to shape the leads or other portions of the leadframe structure. For example, the leadframe structure can be formed by stamping, or by etching a continuous conductive sheet to form a predetermined pattern. If stamping is used, the leadframe structure may be one of many leadframe structures in an array of leadframe structures that are connected by tie-bars. The leadframe structure array may also be cut to separate the leadframe structures from other leadframes structures. As a result of cutting, portions of a leadframe structure in a final semiconductor die package such as a source lead and a control lead may be electrically and mechanically uncoupled from each other. Thus, a leadframe structure may be a continuous metallic structure or a discontinuous metallic structure.

The semiconductor die package 10 includes a plurality of leads extending from the die attach pads. The package 10 can include a first set of leads 90a-1 extending from the first die attach pad 90a, a second set of leads 90b-1 extending from the second die attach pad 90b, a third set of leads 90c-1 and 90c-2 extending from the third die attach pad 90c, and a fourth set of leads 90d-1 and 90d-2 extending from the fourth die attach pad 90d. As used herein, a "set" of leads may include one or more leads.

The plurality of leads can include at least a first control lead 90a-1, a second control lead 90b-1, a third control lead 90c-1, and a fourth control lead 90d-1, and each can comprise a control lead for a different semiconductor die in the plurality of semiconductor dies. In exemplary embodiments, the control leads may comprise gate leads, and each may be electrically coupled to a gate region in the semiconductor die attached to the respective die attach pad, using wires or other conductive structures as shown. In the embodiment shown in FIG. 1, first control lead 90a-1 is electrically coupled to the gate region of the first semiconductor die 80a by wire 36, second control lead 90b-1 is electrically coupled to the gate region of the second semiconductor die 80b by wire 38, third control lead 90c-1 is electrically coupled to the gate region of the third semiconductor die 80c by wire 46, and fourth control lead 90d-1 is electrically coupled to the gate region of the fourth semiconductor die 80c by wire 48. Although one wire per control lead is shown, embodiments of the invention may include multiple wires per control lead, or other structures such as conductive clips.

As shown in embodiments of FIG. 1, the control leads in the dies 80a-80d can be at opposite sides of the semiconductor die package 10. The control leads may also be at opposing corner regions of the package 10. Thus, each corner (as in a top view of the package 10 shown) may include a control lead. In exemplary embodiments, the first control lead 90a-1 and the third control lead 90c-1 can be on the same side of the semiconductor die package 10 as each other; the second control lead 90b-1 may be on the same side of the semiconductor die package 10 as the fourth control lead 90d-1. With this layout as seen in FIG. 1, the first control lead 90a-1 and the third control lead 90c-1 are at opposite sides of the semiconductor die package 10 from the second control lead 90b-1 and the fourth control lead 90d-1. The orientation of each semiconductor die can allow for economical and efficient connections to each control lead, as will be discussed in greater detail below.

Referring to FIG. 1, the plurality of leads may also include first source leads 90c-2 and second source leads 90d-2. First source lead 90c-2 may be electrically coupled to the source region of third semiconductor die 80c, and second source leads 90d-2 may be electrically coupled to the source region of the fourth semiconductor die 80d, by bond wires or other conductive structures. In exemplary embodiments, first source leads 90c-2 can be on the same side of the semiconductor die package 10 as (and parallel with) the first control lead 90a-1 and the third control lead 90c-1. These leads can be on the opposite side of the semiconductor device package 10 as second source leads 90d-2, which are themselves on the same side of the package 10 as (and parallel with) the second control lead 90b-1 and the fourth control lead 90d-1.

Figure 2:
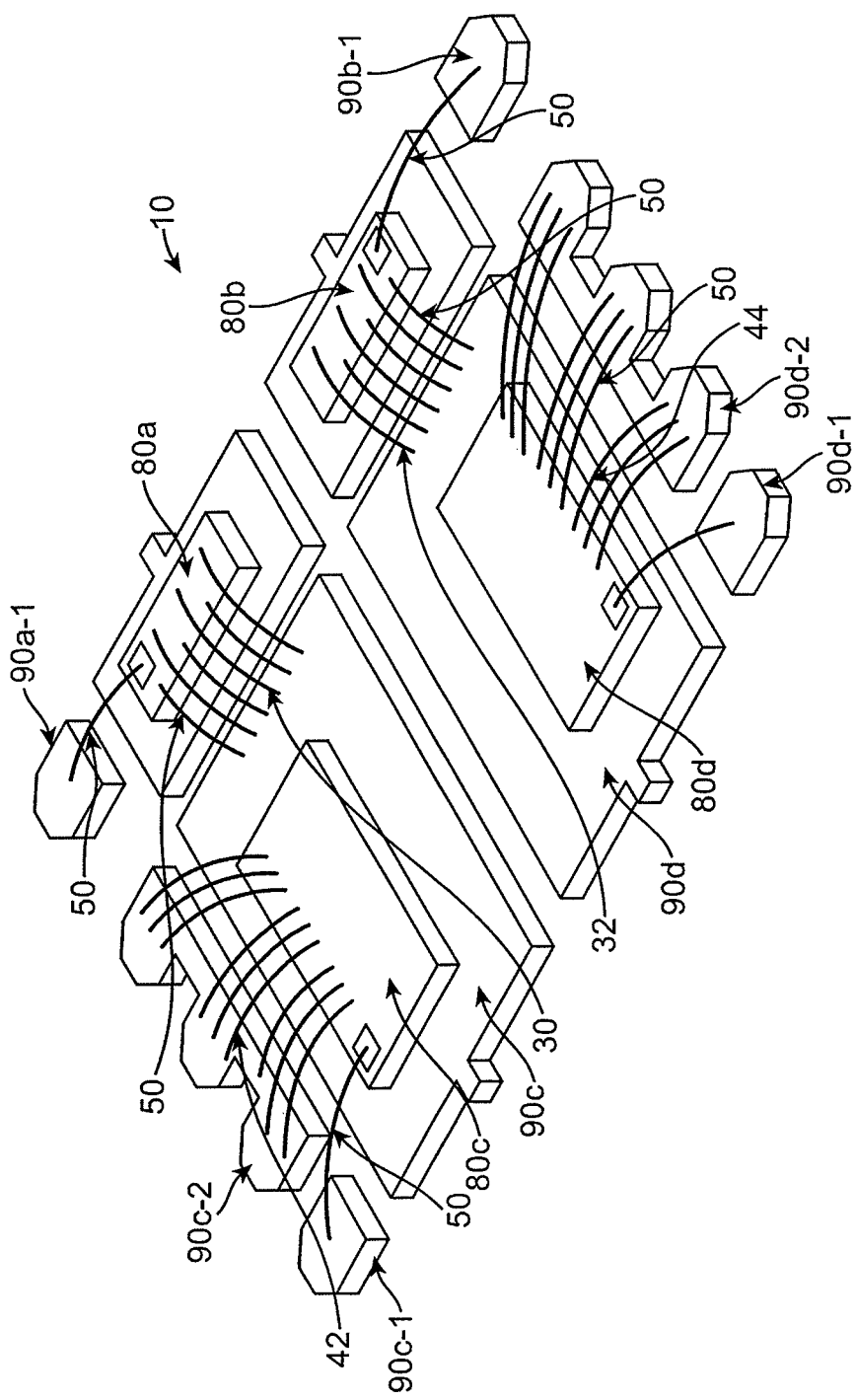
FIG. 2 shows a perspective view of the components shown in FIG. 1.

Referring to FIG. 2, a plurality of conductive structures 50 (e.g., bond wires, ribbon wires, clips, etc) can electrically couple the semiconductor dies and the leadframe. Control conductive structures may electrically couple each control lead (90a-1, 90b-1, 90c-1, 90d-1) to a respective gate of a corresponding semiconductor die 80a, 80b, 80c, and 80d as described above. First source conductive structures 42 can electrically couple first source leads 90c-2 to the source region of the third semiconductor die 80c. Second source conductive structures 44 can electrically couple second source leads 90d-2 to the source region of the fourth semiconductor die 80d. Each of the source conductive structures may comprise one or more (e.g., one or a plurality) of bond wires, to allow for greater source current flow.

In an exemplary embodiment of the invention, the drain (or more generically an output) in the third semiconductor die 80c can be electrically coupled to the source (or more generically an input) in the first semiconductor die 80a. Likewise, the drain (or more generically an output) in the fourth semiconductor die 80d can be electrically coupled to the source (or more generically an input) in the second semiconductor die 80b. Thus, the semiconductor die package 10 may contain one or more internally connected switch nodes (e.g., two internally connected switch nodes within the package) when used in a converter circuit.

FIG. 2 illustrates an implementation where at least one conductive structure 30 (e.g., a plurality of conductive structures) can provide a connection between the source region in the first semiconductor die 90*a* and the third die attach pad 90*c*, and consequently to the drain region in the third semiconductor die 80*c*. In this implementation, the first conductive structure 30 can provide for a first internally connected switch node, of a buck converter circuit comprising the semiconductor die package 10. At least one conductive structure 32 (e.g., a plurality of conductive structures) can provide a connection between the source region in the second semiconductor die 80*b* and the fourth die attach pad 90*d*, and consequently to the drain region in the fourth semiconductor die 80*d*. In this implementation, the second conductive structure 32 can provide for a second internally connected switch node, of a buck converter circuit comprising the semiconductor die package 10.

Semiconductor die packages according to certain embodiments described herein may comprise four separate semiconductor dies. These semiconductor dies may be oriented within the package for optimal placement and performance.

Figure 3:
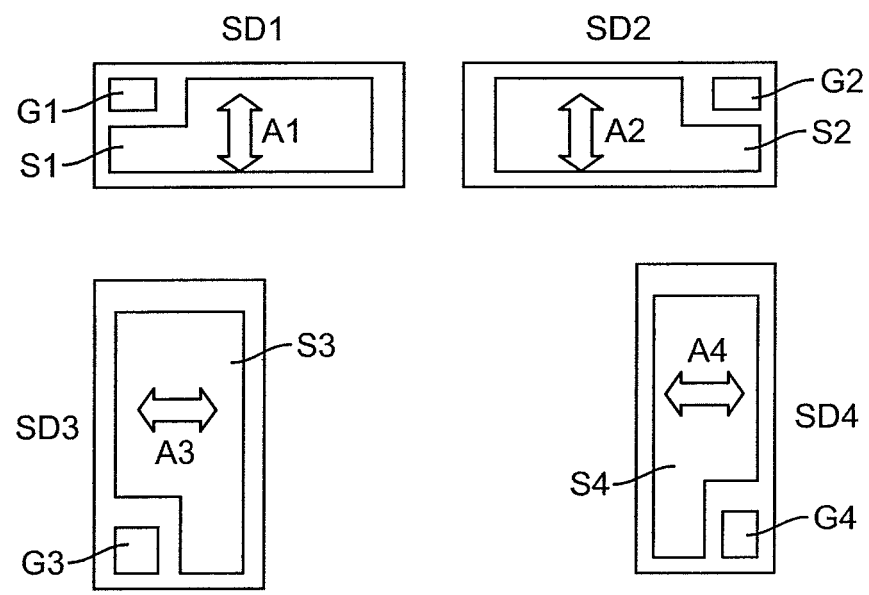
FIG. 3 shows a top view of an embodiment of an orientation of semiconductor dies within a semiconductor die package.

FIG. 3 depicts a top plan view of a layout of a plurality of semiconductor dies according to one embodiment of the invention. The view of FIG. 3 is solely of the semiconductor dies, to illustrate the orientation of the dies. In this embodiment, the orientation of the plurality of semiconductor die can allow for efficient connections to various parts to the semiconductor die package, to reduce parasitic losses. The plurality of semiconductor dies can comprise vertical semiconductor devices (e.g., vertical power MOSFETs) that form at least a part of a buck converter circuit, such as a dual output buck converter circuit. The plurality of dies herein may include a synchronous rectifier which has a source connected perpendicular to the control-synchronous die arrangement. In one implementation, the plurality of semiconductor dies can comprise two high side semiconductor dies (SD1, SD2) and two low side semiconductor dies (SD3, SD4), each having a respective source region (S1, S2, S3, S4) and a gate region (G1, G2, G3, G4). In some embodiments, a drain region may be on the underside of each semiconductor die (not shown).

As shown in FIG. 3, each semiconductor die has an associated arrow, to illustrate the orientation of the die. Each arrow (A1, A2, A3, A4) points in the direction of the respective semiconductor die's source connective structure(s) for the die package, as shown in FIG. 2 (i.e., the "orientation" of the die). That is, arrow A1 shows the orientation of the first semiconductor die SD1, arrow A2 shows the orientation of the second semiconductor die SD2, arrow A3 shows the orientation of the third semiconductor die SD3, and arrow A4 shows the orientation of the fourth semiconductor die SD4. The source region of each semiconductor die (S1, S2, S3, S4) may have the same orientation as its respective die (SD1, SD2, SD3, SD4). The orientation of source region S1 of the first semiconductor die SD1 is parallel to the orientation of source region S2 of the second semiconductor die SD2. Likewise, the orientation of source region S4 of the third semiconductor die SD3 is parallel to the orientation of source region S4 of the fourth semiconductor die SD4. Furthermore, the source regions (S1, S2) of the first and second semiconductor dies (SD1, SD2) are each oriented perpendicular (i.e., at a 90° angle) to the source regions (S3, S4) of the third and fourth semiconductor dies (SD3, SD4). This orientation places the gate region of each semiconductor die at the outer corner of the semiconductor package. Moreover, the source regions (S3, S4) of the low side semiconductor dies (SD3, SD4) can connect to source leads on opposing sides of the semiconductor package.

The semiconductor dies in the plurality of semiconductor dies shown in FIG. 3 comprise rectangular shaped vertical power semiconductor dies. In other embodiments contemplated herein, the semiconductor dies may not be rectangular shaped (e.g., one or more dies may be square shaped), may not be a vertical power die, or may be neither rectangular shaped or comprise a vertical power device. In the illustrated embodiment of FIG. 3, each semiconductor die is rectangular shaped, and the orientation of a semiconductor die, or of the source region of that semiconductor die, refers to the direction of travel from one long edge of the die to the other. In embodiments which use one or more square shaped semiconductor dies, the orientation of each die may comprise the direction that die's source connection.

Figure 4:
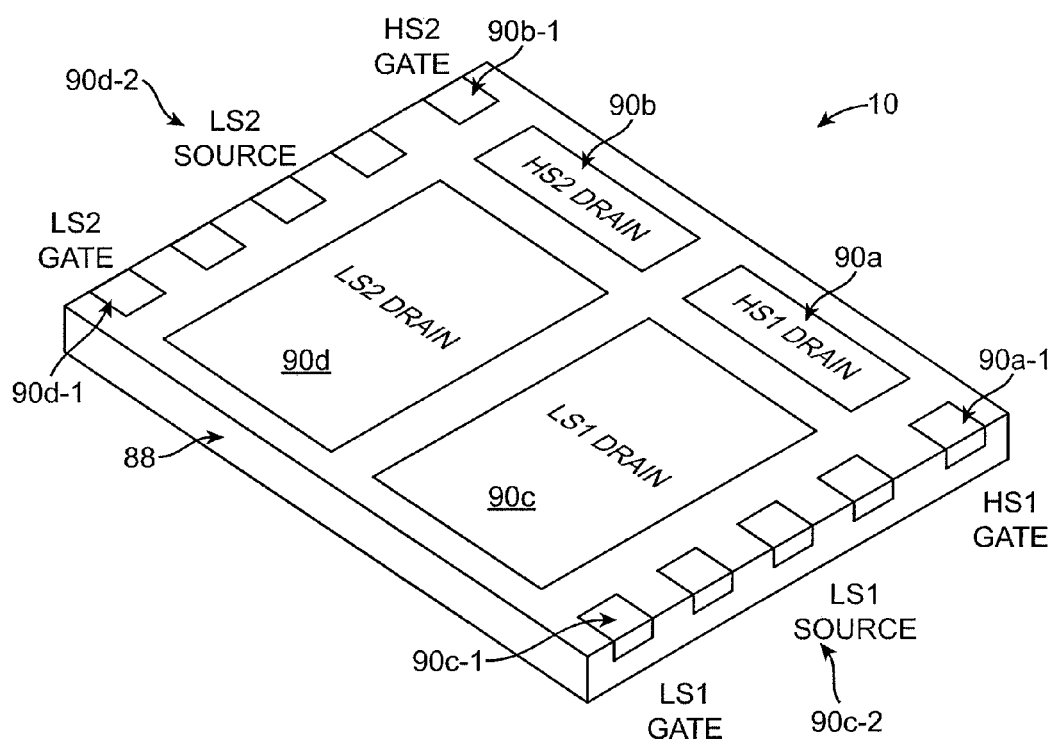
FIG. 4 shows a bottom perspective view of a semiconductor die package according to an embodiment of the invention.

Referring to FIG. 4, a housing 88 is provided in the semiconductor die package 10 and protects the plurality of semiconductor dies. The housing 88 may have an exterior surface and at least partially covers the semiconductor dies and the leadframe structure. The bottom surface of the housing 88 may be substantially coplanar with exterior surfaces of the die attach pads (90*a*, 90*b*, 90*c*, 90*d*), as well as with exterior surfaces of the leads (90*a*-1, 90*b*-1, 90*c*-1, 90*c*-2, 90*d*-1, 90*d*-2). The exterior surfaces of the leads (90*a*-1, 90*b*-1, 90*c*-1, 90*c*-2, 90*d*-1, 90*d*-2), and the exterior surfaces of the die attach pads (90*a*, 90*b*, 90*c*, 90*d*) may serve as connection terminals for the semiconductor die package 10 when the semiconductor die package 10 is mounted to a circuit substrate such as a printed circuit board (PCB). Since the lateral edges of the leads 9(90A-1, 90*b*-1, 90*c*-1, 90*c*-2, 90*d*-1, 90*d*-2) do not extend past the lateral surface of the housing 88, the semiconductor die package 10 illustrated in FIG. 4 may be characterized as a "leadless" package. A "leaded" package can be one in which the leads of the package extend past the lateral edges of the housing 88 of the semiconductor die package 10. Embodiments of the invention can include both leaded and leadless packages.

In exemplary embodiments, each die attach pad can comprise a drain pad, as seen in FIG. 4. Each semiconductor die may be attached to a respective drain pad, such that the drain region of the die is proximate to the drain pad, and the source region of the die is distal to the drain pad. Thus, the first drain pad 90*a* can be electrically coupled with the drain region of the first semiconductor die 80*a*, the second drain pad 90*b* can be electrically coupled with the drain region of the second semiconductor die 80*b*, the third drain pad 90*c* can be electrically coupled with the drain region of the third semiconductor die 80*c*, and the fourth drain pad 90*d* can be electrically coupled with the drain region of the fourth semiconductor die 80*d*. Some or all of these die attach pads can be directly connected to a pad on a circuit substrate (such as in FIG. 7) to provide a connection from the circuit substrate to the drain of each semiconductor device. In some examples, there may be no lead in the package which connects directly to the drain (or more generically an output) of one or more of the semiconductor devices. In other embodiments, only certain semiconductor dies, in the plurality of semiconductor dies of the package, may have drain regions connected to an exposed lead or die pad.

Figure 5:
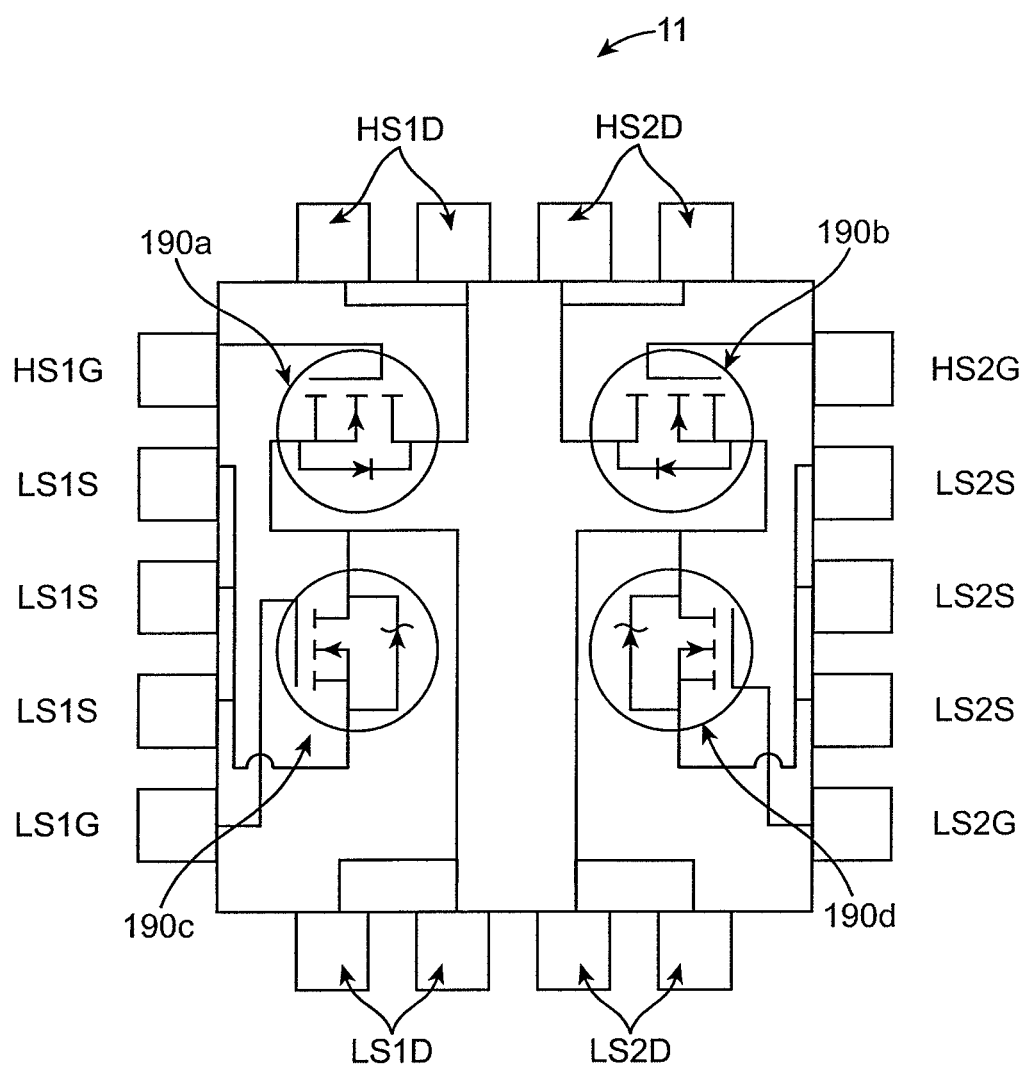
FIG. 5 shows a schematic illustration of a circuit diagram in a semiconductor die package.

The packages according to embodiments of the invention can form part of a dual output or phase synchronous buck converter circuit. A buck converter can use a driver IC, high-side power MOSFETs (metal oxide semiconductor field effect transistors), and low-side power MOSFETs. FIG. 5 shows a simplified schematic diagram of the MOSFETs in a semiconductor die package 11, that can be used in a typical buck converter. The buck converter can include high-side MOSFETs 190*a*, and 190*b*, and low-side MOSFETs 190*c* and 190*d*. The drains of the low-side MOSFETs (190*c*, 190*d*), can each be electrically connected to a source of one of the high-side MOSFETs (190a, 190b). Leads HS1G, HS2G, LS1G, and LS2G can be gate leads. Leads LS1S and LS1S may be source leads. In certain embodiments, leads HS1D, HS2D, LS1D, and LS2D may each connect to a die attach pad, and thus to a respective drain region of each semiconductor die. In certain embodiments and as shown in FIG. 4, the drain regions of the plurality of semiconductor dies may be electrically coupled to drain pads exposed on the bottom of the die package, but may not be electrically coupled to any leads on the sides of the die package.

Figure 6:
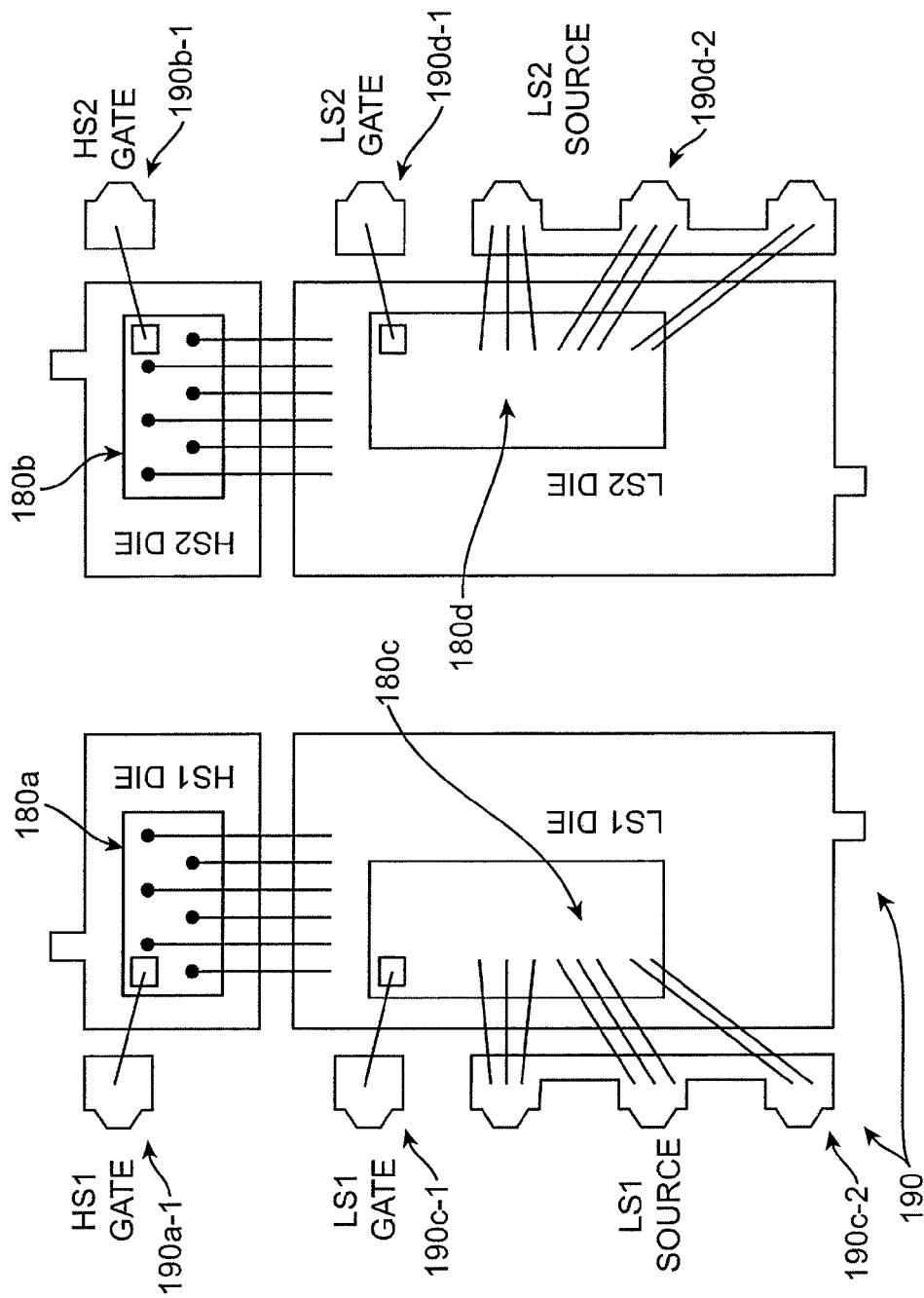
FIG. 6 shows a top view of another embodiment of a package without a molding material.

FIG. 6 discloses another exemplary embodiment of a layout of a semiconductor die package. In this embodiment, a plurality of semiconductor dies (180a, 180b, 180c, 180d) can be attached to die attach pads of a leadframe 190. In certain implementations, the die package may be at least a portion of a buck converter circuit, and may include high side semiconductor dies (180a, 180b) and low side semiconductor dies (180c, 180d). Furthermore, the control leads (190a-1, 190b-1) for the first and second semiconductor dies (180a, 180b) can remain at the upper left and right corners of the package. The first control lead 190a-1 may be electrically coupled to a gate region on the first semiconductor die 180a, and the second control lead 190b-1 may be electrically coupled to a gate region on the second semiconductor die 180b. The lower corners of the package can include the source leads (190c-2, 190d-2) for the third and fourth semiconductor dies (180c, 180d). The control leads (190c-1, 190d-1) for the third and fourth semiconductor devices (180c, 180d) may be on opposite sides of the semiconductor die package from each other, and each control lead may be located between the a control lead for a high side semiconductor die and the source leads for a low side semiconductor die. For example, third control lead 190c-1 may be electrically coupled to a gate region of third semiconductor die 180c, and may be located between first control lead 190a-1 and first source leads 190c-2. Likewise, fourth control lead 190d-1 may be electrically coupled to a gate region of third semiconductor die 180d, and may be located between second control lead 190b-1 and second source leads 190d-2. In this embodiment, the third control lead 190c-1 is adjacent to the first control lead 190a-1, and the second control lead 190b-1 is adjacent to the fourth control lead 190d-2. In this manner the control leads for the third and fourth dies 180c, 180d (e.g. low side MOSFET dies) are located in the middle of the side of the package, allowing for varied circuit layouts.

Figure 7:
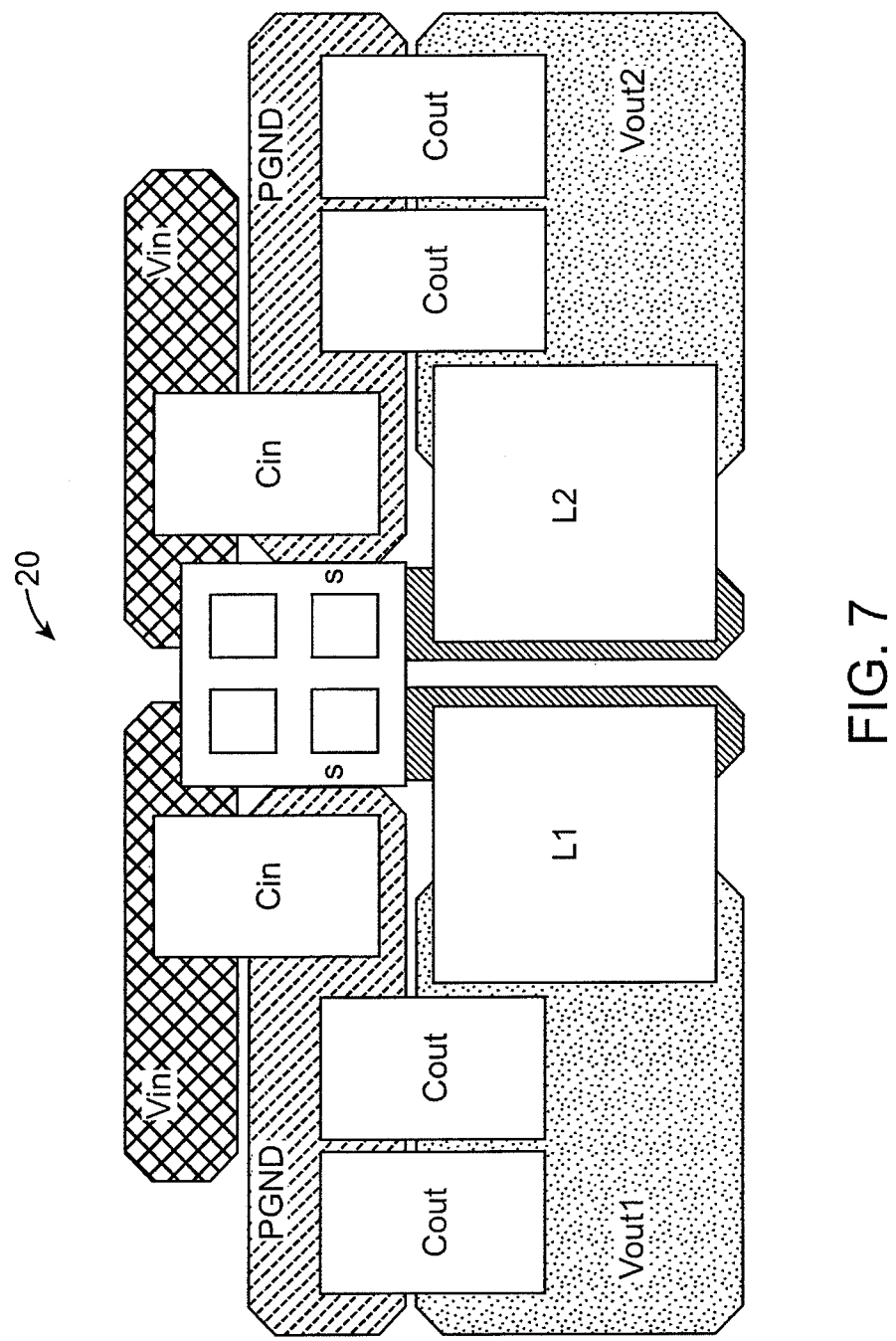
FIG. 7 shows an example of a layout arrangement of a package.

Embodiments of the invention may be used in suitable electrical assemblies where the above-described semiconductor die packages are mounted on a circuit substrate or the like. The electrical assemblies may be present in larger more complex systems including servers, notebook computers, cellular phones, etc. Referring to FIG. 7, a top view of a printed circuit board layout is shown, using a semiconductor die package according to an embodiment of the invention. Semiconductor die package 20 can include four semiconductor dies (e.g., each die having a MOSFET) and may form at least a portion of a buck converter circuit. The layout may further include various capacitors (Cin, Cout), inductors (L1, L2) and connection traces. The control (e.g. gate) connection traces may be on different board layers (not shown). In some implementations, L1 and L2 may each have dimensions of 10 mm by 10 mm (or 7 mm by 7 mm), and package 20 may have a size of 8 mm by 8 mm. In certain implementations, the two input connections to the semiconductor die package Vin may be connected together. This implementation can be used, for instance, when a single input is provided for both outputs.

Another embodiment of the invention is directed to a method for making a semiconductor die package. It includes obtaining a leadframe structure having a plurality of die attach pads and a plurality of leads extending from the plurality of die attach pads. In certain embodiments, the plurality of leads can comprise at least a first control lead, a second control lead, a third control lead, and a fourth control lead, and the plurality of die attach pads may comprise a first die attach pad, a second die attach pad, a third die attach pad, and a fourth die attach pad. The leadframe structure may have tie bar portions, which may be used to connect the leadframe structure to other leadframe structures (not shown) in an array of leadframe structures, so that many die packages can be produced in parallel. In certain embodiments, after the housing is formed, the formed package may be separated from other packages processed in a similar manner, and may be tested and marked.

The method further comprises obtaining a plurality of semiconductor dies (e.g. four dies, six dies, etc.), and attaching each die attach pad in the plurality of die attach pads to a semiconductor die in the plurality of semiconductor dies. This can comprise attaching the first die attach pad to a first semiconductor die, attaching the second die attach pad to a second semiconductor die, attaching the third die attach pad to a third semiconductor die, and attaching the fourth die attach pad to a fourth semiconductor die. The method can also comprise electrically coupling the dies to the leadframe, such as by attaching a first conductive structure to a first source region in the first semiconductor die and to the third die attach pad; and attaching a second conductive structure to a second source region in the second semiconductor die and to the fourth die attach pad. The conductive structures may comprise bond wires, conductive clips, etc.

A housing may then be provided for the package, the housing comprising an exterior surface at least partially covering each semiconductor die. This can form the semiconductor die package, and the first control lead and the third control lead can be at opposite sides of the semiconductor die package from the second control lead and the fourth control lead. In some embodiments, the housing may comprise a molding material (e.g., an epoxy molding material) which may be molded around the dies and the leadframe structure. The housing can then be provided by molding a molding a molding material around the leadframe structure and the plurality of semiconductor dies, wherein the molding material leaves exposed the portions of the leadframe structure. Various known molding processes can be used. For example, a tape assisted molding process could be used in some embodiments, while a molding tool with molding dies can be used on other embodiments of the invention. If molding is not used, a housing could simply be assembled around the dies and the leadframe structure. After the housing is fanned, the formed package may be separated from other packages processed in a similar manner, and may be tested and marked. The package may then be used in a synchronous buck converter circuit, or other suitable application.

The semiconductor dies may comprise MOSFETs in the illustrated examples, but may comprise any suitable semiconductor device in other embodiments of the invention. Suitable devices may include vertical or horizontal devices. Vertical devices have at least an input at one side of the die and an output at the other side of the die so that current can flow vertically through the die. Horizontal devices include at least one input at one side of the die and at least one output at the same side of the die so that current flows horizontally through the die.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. During operation, the current flow from the source region to the drain region in a VDMOS device is substantially perpendicular to the die surfaces. Embodiments disclosed herein may use either P- or N-channel MOSFETs, or a combination.

Embodiments as disclosed herein have a number of advantages. The pinout convention (i.e., location of the leads) depicted in certain embodiments allows for ease of layout of a dual output or phase synchronous buck converter. This can allow a user to simplify placement of power train components such as inductors, capacitors and transistors in a circuit. Embodiments disclosed herein can provide a user the advantages of creating more dense power supplies, which are critical for reducing board area. The product can be made in small sized form factors, and the reduced footprint can allow for improved placement and routing. Also, the exposed die attach pads on the bottom of the package can have superior heat dissipation and electrical connectivity to exterior devices, such as circuit boards.

The design of certain embodiments further enables PCB layouts to reduce parasitic loss due to routing. Embodiments disclosed herein describe internally connected switch nodes, which can have very low inductance or other parasitic losses. This allows the semiconductor die package to be used in buck converters with high operating frequencies. In certain embodiments, the package may include a synchronous rectifier which has a source connected at a 90° angle (i.e., perpendicular) from the control-synchronous die arrangement. Also, as described above, the source of the two low side dies can be at a 90° angle (i.e., perpendicular) to the sides of the package. This allows the pinout of embodiments of the package to be optimized, which in turn can allow the power train components to be optimized, such as having copper traces with reduced parasitic losses. This also enables easier routing for the user. In addition, certain embodiments of the package provide for buck converter circuits with the capability of two outputs or phases, as opposed to one.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed.

Moreover, any one or more features of any embodiment of the invention may be combined with any one or more other features of any other embodiment of the invention, without departing from the scope of the invention. For example, although wires are used in the specific examples, above, conductive clips or other conductive structures could alternatively be used in other embodiments of the invention. Any use of "a", "an", or "the" is intended to mean "one or more" unless specifically indicated to the contrary. Furthermore, where examples described herein recite a singular "lead," a plurality (i.e., two or more) of leads may be used in certain implementations. Similarly, where examples disclose plural "leads," a single lead may be used where suitable to one skilled in the art.

All patents, patent applications, publications, and descriptions mentioned above are herein incorporated by reference in their entirety for all purposes. None is admitted to be prior art.

What is claimed is:

1. A semiconductor die package comprising:
a leadframe structure having a plurality of die attach pads and a plurality of leads extending from the plurality of die attach pads, wherein the plurality of leads comprises at least a first control lead, a second control lead, a third control lead, and a fourth control lead;
a plurality of semiconductor dies, wherein each semiconductor die in the plurality of semiconductor dies is attached to a die attach pad in the plurality of die attach pads; and
a housing comprising an exterior surface and at least partially covering the plurality of semiconductor dies,
wherein the first control lead and the third control lead are at opposite sides of the semiconductor die package from the second control lead and the fourth control lead, and
wherein each die attach pad in the plurality of die attach pads serves as a drain connection for a different semiconductor die.

2. A semiconductor die package comprising:
a leadframe structure having a plurality of die attach pads and a plurality of leads extending from the plurality of die attach pads, wherein the plurality of leads comprises at least a first control lead, a second control lead, a third control lead, and a fourth control lead;
a plurality of semiconductor dies, wherein each semiconductor die in the plurality of semiconductor dies is attached to a die attach pad in the plurality of die attach pads; and
a housing comprising an exterior surface and at least partially covering the plurality of semiconductor dies,
wherein the first control lead and the third control lead are at opposite sides of the semiconductor die package from the second control lead and the fourth control lead,
wherein the plurality of die attach pads comprises a first die attach pad, a second die attach pad, a third die attach pad, and a fourth die attach pad,
wherein the plurality of semiconductor dies comprises a first semiconductor die attached to the first die attach pad, a second semiconductor die attached the second die attach pad, a third semiconductor die attached to the third die attach pad, and a fourth semiconductor die attached to the fourth die attach pad, and
wherein the first semiconductor die comprises a first drain region proximate to the first die attach pad and a first source region distal to the first die attach pad, the second semiconductor die comprises a second drain region proximate to the second die attach pad and a second source region distal to the second die attach pad, the semiconductor die package further comprising:
a first conductive structure providing a connection between the first source region in the first semiconductor die and the third die attach pad; and
a second conductive structure providing a connection between the second source region in the second semiconductor die and the second die attach pad.

3. A semiconductor die package comprising:
a leadframe structure having a plurality of die attach pads and a plurality of leads extending from the plurality of die attach pads, wherein the plurality of leads comprises at least a first control lead, a second control lead, a third control lead, and a fourth control lead;
a plurality of semiconductor dies, wherein each semiconductor die in the plurality of semiconductor dies is attached to a die attach pad in the plurality of die attach pads; and a housing comprising an exterior surface and at least partially covering the plurality of semiconductor dies, wherein the first control lead and the third control lead are at opposite sides of the semiconductor die package from the second control lead and the fourth control lead, wherein the plurality of die attach pads comprises a first die attach pad, a second die attach pad, a third die attach pad, and a fourth die attach pad, wherein the plurality of semiconductor dies comprises a first semiconductor die attached to the first die attach pad, a second semiconductor die attached the second die attach pad, a third semiconductor die attached to the third die attach pad, and a fourth semiconductor die attached to the fourth die attach pad, and wherein the plurality of leads comprises at least a first source lead electrically connected to a source region of the third semiconductor die, and at least a second source lead electrically connected to a source region of the fourth semiconductor die, wherein the first source lead is on the same side of the semiconductor die package as the first control lead and the third control lead, and wherein the second source lead is on the same side of the semiconductor die package as the second control lead and the fourth control lead.

4. A semiconductor die package comprising:
a leadframe structure having a plurality of die attach pads and a plurality of leads extending from the plurality of die attach pads, wherein the plurality of leads comprises at least a first control lead, a second control lead, a third control lead, and a fourth control lead;
a plurality of semiconductor dies, wherein each semiconductor die in the plurality of semiconductor dies is attached to a die attach pad in the plurality of die attach pads; and
a housing comprising an exterior surface and at least partially covering the plurality of semiconductor dies,
wherein the first control lead and the third control lead are at opposite sides of the semiconductor die package from the second control lead and the fourth control lead, and
wherein the plurality of semiconductor dies comprises a low side semiconductor die having a source region and a high side semiconductor die having a source region, wherein the source region of the low side semiconductor die is oriented perpendicular to the source region of the high side semiconductor die.

5. The semiconductor die package of claim 4, wherein the plurality of semiconductor dies comprises two low side semiconductor dies, each having a source region, and two high side semiconductor dies, each having a source region, wherein the source regions of the low side semiconductor dies are oriented perpendicular to the source regions of the high side semiconductor dies.

6. A semiconductor die package comprising:
a leadframe structure having a plurality of die attach pads and a plurality of leads extending from the plurality of die attach pads, wherein the plurality of leads comprises at least a first control lead, a second control lead, a third control lead, and a fourth control lead;
a plurality of semiconductor dies, wherein each semiconductor die in the plurality of semiconductor dies is attached to a die attach pad in the plurality of die attach pads; and
a housing comprising an exterior surface and at least partially covering the plurality of semiconductor dies, wherein the first control lead and the third control lead are at opposite sides of the semiconductor die package from the second control lead and the fourth control lead, and wherein each semiconductor die in the plurality of semiconductor dies comprises a vertical power MOSFET.

7. A semiconductor die package comprising:
a leadframe structure having a plurality of die attach pads and a plurality of leads extending from the plurality of die attach pads, wherein the plurality of leads comprises at least a first control lead, a second control lead, a third control lead, and a fourth control lead;
a plurality of semiconductor dies, wherein each semiconductor die in the plurality of semiconductor dies is attached to a die attach pad in the plurality of die attach pads; and
a housing comprising an exterior surface and at least partially covering the plurality of semiconductor dies, wherein the first control lead and the third control lead are at opposite sides of the semiconductor die package from the second control lead and the fourth control lead, and
wherein the plurality of semiconductor dies comprises four semiconductor dies that form at least a part of a buck converter circuit.

8. The semiconductor die package of claim 7, wherein the buck converter circuit comprises a dual output buck converter circuit.

9. A method for making a semiconductor die package, the method comprising:
obtaining a leadframe structure having a plurality of die attach pads and a plurality of leads extending from the plurality of die attach pads, wherein the plurality of leads comprises at least a first control lead, a second control lead, a third control lead, and a fourth control lead;
obtaining a plurality of semiconductor dies;
attaching each die attach pad in the plurality of die attach pads to a semiconductor die in the plurality of semiconductor dies;
providing a housing comprising an exterior surface at least partially covering each semiconductor die, wherein the first control lead and the third control lead are at opposite sides of the semiconductor die package from the second control lead and the fourth control lead;
attaching a first conductive structure to a first source region in the first semiconductor die and to the third die attach pad; and
attaching a second conductive structure to a second source region in the second semiconductor die and to the fourth die attach pad.

10. A method for making a semiconductor die package, the method comprising:
obtaining a leadframe structure having a plurality of die attach pads and a plurality of leads extending from the plurality of die attach pads, wherein the plurality of leads comprises at least a first control lead, a second control lead, a third control lead, and a fourth control lead;
obtaining a plurality of semiconductor dies;
attaching each die attach pad in the plurality of die attach pads to a semiconductor die in the plurality of semiconductor dies; and
providing a housing comprising an exterior surface at least partially covering each semiconductor die, wherein the first control lead and the third control lead are at opposite sides of the semiconductor die package from the second control lead and the fourth control lead, and wherein each die attach pad comprises a drain pad.

11. A method for making a semiconductor die package, the method comprising:
- obtaining a leadframe structure having a plurality of die attach pads and a plurality of leads extending from the plurality of die attach pads, wherein the plurality of leads comprises at least a first control lead, a second control lead, a third control lead, and a fourth control lead;
- obtaining a plurality of semiconductor dies;
- attaching each die attach pad in the plurality of die attach pads to a semiconductor die in the plurality of semiconductor dies; and
- providing a housing comprising an exterior surface at least partially covering each semiconductor die,
- wherein the first control lead and the third control lead are at opposite sides of the semiconductor die package from the second control lead and the fourth control lead, and
- wherein the providing a housing comprises molding a molding material around the leadframe structure and the plurality of semiconductor dies to form the semiconductor die package, wherein the molding material leaves exposed portions of the leadframe structure and
- wherein the plurality of semiconductor dies comprises a low side semiconductor die having a source region and a high side semiconductor die having a source region, wherein the source region of the low side semiconductor die is oriented perpendicular to the source region of the high side semiconductor die.

12. A synchronous buck converter comprising a semiconductor die package formed by a method comprising:
- obtaining a leadframe structure having a plurality of die attach pads and a plurality of leads extending from the plurality of die attach pads, wherein the plurality of leads comprises at least a first control lead, a second control lead, a third control lead, and a fourth control lead;
- obtaining a plurality of semiconductor dies;
- attaching each die attach pad in the plurality of die attach pads to a semiconductor die in the plurality of semiconductor dies; and
- providing a housing comprising an exterior surface at least partially covering each semiconductor die,
- wherein the first control lead and the third control lead are at opposite sides of the semiconductor die package from the second control lead and the fourth control lead.

* * * * *